United States Patent [19]

Niemiö

[11] Patent Number: 5,164,685
[45] Date of Patent: Nov. 17, 1992

[54] PHASE-LOCKED LOOP WITH CIRCUIT FOR ADJUSTING A PHASE COMPARATOR'S OUTPUT AMPLITUDE

[75] Inventor: Mika E. Niemiö, Salo, Finland

[73] Assignee: Nokia Mobile Phones Ltd., Salo, Finland

[21] Appl. No.: 698,483

[22] Filed: Apr. 4, 1991

Related U.S. Application Data

[63] Continuation of PCT/FI88/00124, Aug. 4, 1988.

[30] Foreign Application Priority Data

Mar. 5, 1987 [FI] Finland .................................. 870982

[51] Int. Cl.$^5$ ............................................. H03L 7/107
[52] U.S. Cl. ............................................. 331/8; 331/17; 331/25
[58] Field of Search ................. 331/1 A, 17, 25, 27, 331/8

[56] References Cited

U.S. PATENT DOCUMENTS 4,107,624  8/1978  Turner .............................. 331/17 X
4,590,440  5/1986  Hague et al. ....................... 331/17

FOREIGN PATENT DOCUMENTS 60-142624  7/1985  Japan .

Primary Examiner—Siegfried H. Grimm
Attorney, Agent, or Firm—Darby & Darby

[57] ABSTRACT

The object of the description is a phase-locked loop circuit in the form of an integrated circuit (IC) including in sequential connection a digital phase comparator, to the input of which is supplied a reference frequency (fref); a loop filter; and a voltage-controlled oscillator, from which a feedback branch is fed to the second input of the phase comparator. The voltage ($\phi V$; $\phi R$) of the pulses obtained from the digital phase comparator is disposed so as to be adjusted by limiting means so as to modify the bandwidth and rate of the loop. The adjustment of the voltage of the pulses can be carried out, e.g., by limiting the supply voltage of the phase comparator or by means of an exterior diode or transistor limiter (Q2, Q3). The circuit is usable e.g. in radiotelephone applications, in which loop rate is increased during channel switching.

12 Claims, 7 Drawing Sheets

PHASE-LOCKED LOOP WITH CIRCUIT FOR ADJUSTING A PHASE COMPARATOR'S OUTPUT AMPLITUDE

This is a continuation of PCT application No. PCT/FI88/00124, filed Aug. 4, 1988 which lists the United States as one of the designated countries.

BACKGROUND OF THE INVENTION

The present invention relates to a phase-locked loop circuit comprising in sequential connection: a digital phase comparator, to one input of which a reference frequency is supplied; a loop filter; and a voltage-controlled oscillator, from which a feedback branch is connected to the second input of the phase comparator.

Figure 1:
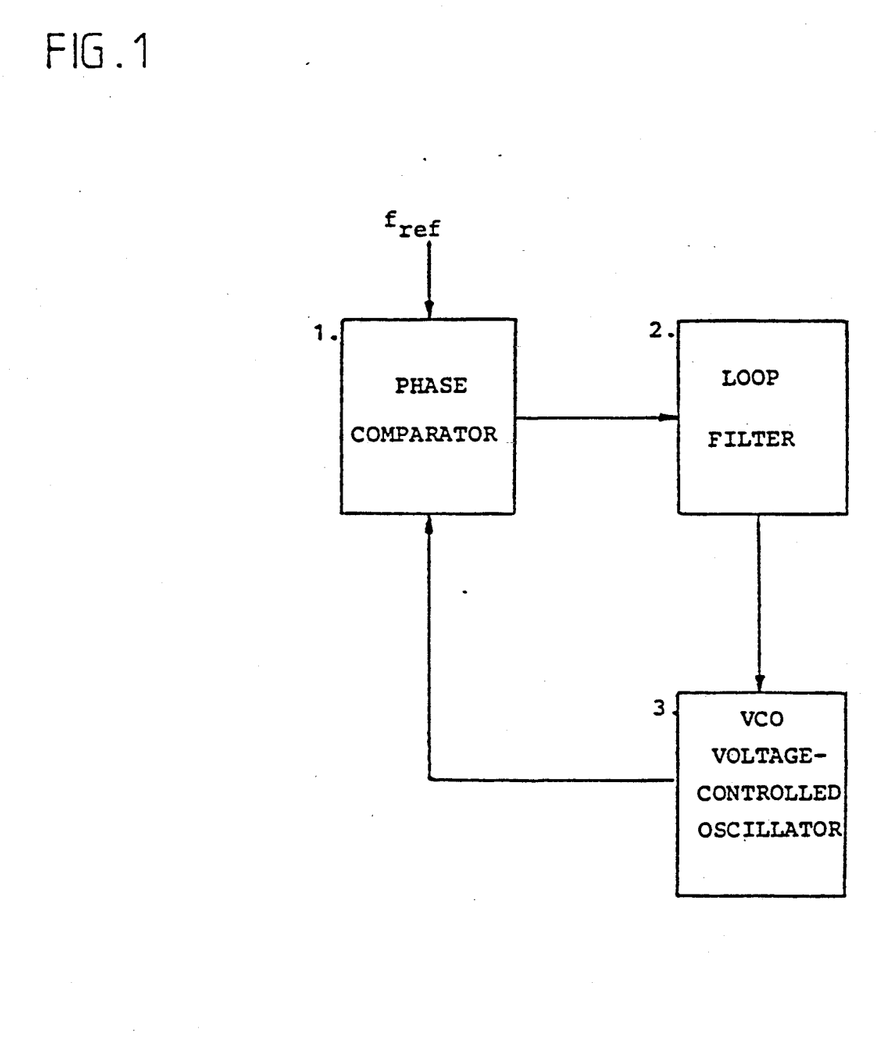
FIG. 1 shows a block diagram of a typical phase-locked loop.

A block diagram of a phase-locked loop is shown in FIG. 1. In the figure, the reference frequency Fref is applied to the input of the phase comparator. The output of the phase comparator is connected to the loop filter 2. The loop filter (2) output is applied to the voltage-controlled oscillator 3. The output of the oscillator 3 is fed back to the phase comparator 1 so as to provide a loop that is locked according to the reference frequency Fref at a certain rate.

It is well known in the art to use a phase-locked loop in frequency synthesizers. When a phase-locked loop is used in a frequency synthesizer, the frequency modulated voltage-controlled oscillator (VCO) imposes, contradictory loop bandwidth requirements. A rapid locking time is desired for channel switching thus requiring, the loop bandwidth to be as high as possible. On the other hand, for the loop not to accentuate nor to damp the frequency modulation, its bandwidth should be far lower than the lowest modulation frequency. A low loop bandwidth also reduces residual modulation and increases the damping of the phase reference frequency.

U.S. Pat. Nos. 4,482,869 and 4,516,083, for instance, and EP patent application 85615 disclose an acceleration of the loop filter by changing the resistance value of the integrator stage of the filter by either removing resistors or by short circuiting them. Correspondingly, the retardation is achieved by removing the short-circuits or adding resistors. In U.S. Pat. No. 4,156,855 the loop is additionally accelerated by using a current pump to increase the current feeding the integrator stage capacitor.

Controlling the resistors with switches, however, disturbs the operation of the loop. Thus, at the moment of switching resistors in a slow loop, a momentary spike usually appears in the adjusting voltage obtained from the VCO, which is inadmissible for some applications, for example radiotelephones. The same happens in the case of a sudden change of the current charging the integrator.

Consequently, a frequency synthesizer formed by a phase-locked loop has been impossible to use without drawbacks where, a rapid locking time or a linear modulation frequency response is required. In cases where a modulated frequency synthesizer is formed by a phase-locked loop there have been compromises between the locking time, the linearity of the modulation frequency response, and the reference frequency damping.

For example, in radiotelephone applications requiring a short locking time and a linear modulation frequency response, it has been necessary to use a so-called transfer oscillator system, in which a modulated fixed transfer oscillator frequency is mixed with the receiver injection frequency. On the other hand, a transfer oscillator has the drawbacks of producing a great number of mixing results, which are difficult to damp and complicated and expensive circuitry.

OBJECT OF THE INVENTION

The object of the present invention is to reduce the above problems and to provide a circuit that uses a modulated frequency synthesizer when both a rapid locking time and a low loop bandwidth are required.

SUMMARY OF THE INVENTION

The present invention solves the problems found in the prior art by modifying the gain of a phase-locked loop by limiting the voltage of the pulses obtained from the digital phase comparator, enabling the use of a high bandwidth, i.e., a rapid loop during the channel switching and a low bandwidth after the loop is locked. Since the transfer oscillator system is not used, no detrimental mixing results are produced.

When modifying the gain of the phase-locked loop by limiting the voltage of the pulses obtained from the digital phase comparator, the gain change does not disturb the loop's operation.

Moreover, the circuit is simple and is appropriate for a commonly used two-output digital phase comparator and an operational amplifier type integrator. The circuit according to the invention allows a stepless adjustment when desired, and the adjustment functions flawlessly even with small phase differences.

According to the present invention, the voltage of the pulses obtained from a digital phase comparator can be changed either in or outside the phase comparator by limiting means i.e. by a diode, transistor, FET, or some other voltage limiting circuit. For example, the pulse voltage limitation can be provided either at the output of the phase comparator or by the circuit set up before the loop filter, as described above and shown in FIGS. 6a, 6b, 7a and 7b. In the phase comparator, the adjustment is feasible, e.g., by changing the supply voltage of the phase comparator itself, or of its output stage.

It is essential that by changing the pulse voltage in the circuit, the gain of the phase-locked loop can be influenced, and thus the bandwidth; and setting time of the loop, among others, can be modified.

It is also essential that the gain change does not disturb the loop operation by limiting the voltage of the pulses obtained from the phase comparator. In addition, the gain is steplessly adjustable.

Thus, it is possible to employ a high bandwidth, i.e., a rapid loop during the channel switching and reduce the loop bandwidth after the locking without disturbing the loop operation.

In this way, a rapid setting time, a linear modulation frequency response, a small residual modulation, and a great reference frequency damping are achieved.

The circuit according to the present invention has several phase-lock applications, such as frequency-synthesis, modulation, or demodulation applications (e.g., AM, FM, PM), a tracking filter, the regeneration of a clock signal, and the like.

The adjustment of a phase-locked loop gain is usable in various applications, e.g., adjustment of the loop bandwidth, acceleration and retardation of the loop, linearization of the modulation frequency response, increasing the reference frequency damping, or, e.g., compensating the change of the loop gain as the divisor changes.

The circuit has the additional advantages of being simple and economical, providing a controllable and stepless adjustment, and the gain adjustment does not disturb the loop operation.

Moreover, the circuit is applicable to digital phase detectors of various types, for instance single-ended output (FIGS. 7a, 7b) or double-ended output (FIGS. 6a, 6b) phase detectors.

BRIEF DESCRIPTION OF THE DRAWINGS

The application of the present invention to a FM modulated frequency-syntheziser is described in detail below as an example and with reference to the enclosed drawings, in which.

DETAILED DESCRIPTION OF THE PREFERRED EMBODIMENTS

Figure 2:
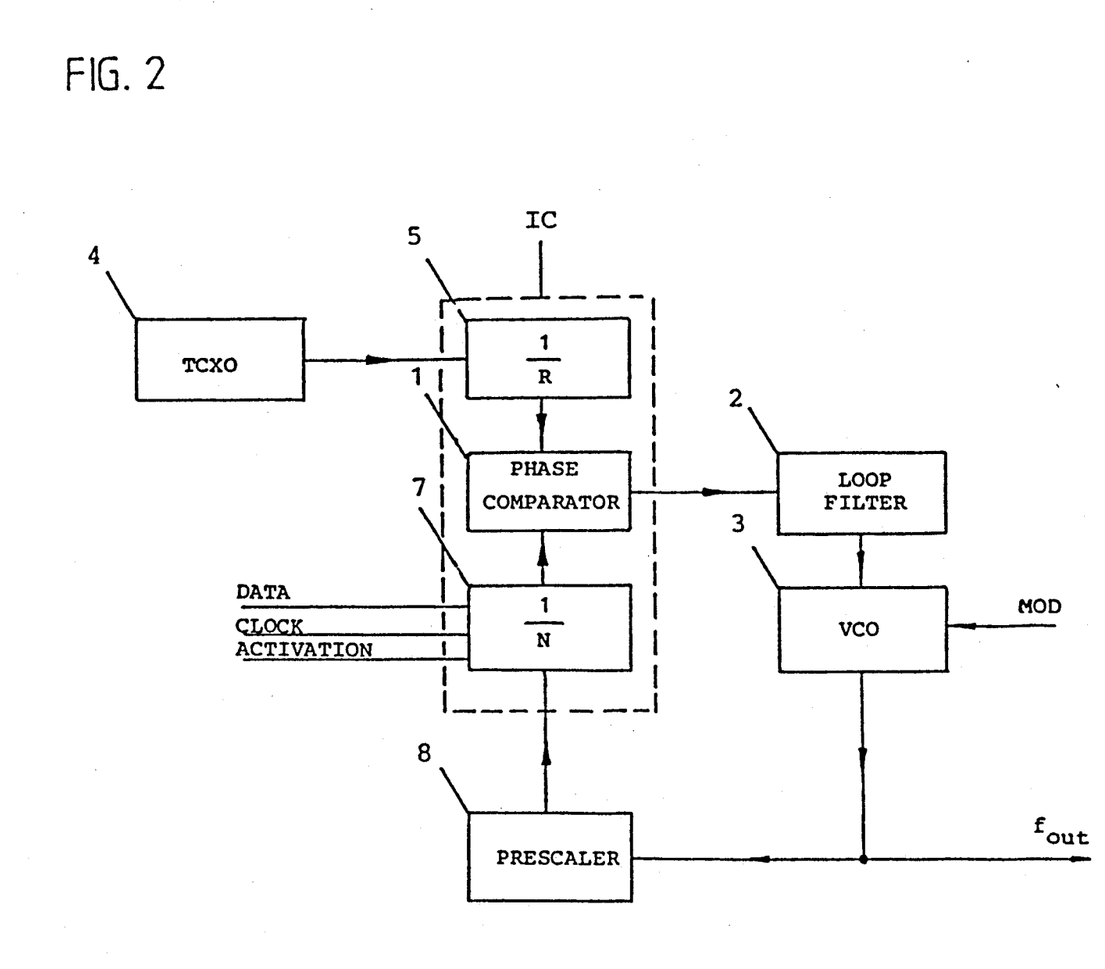
FIG. 2 shows a block diagram of a frequency synthesizer comprising a phase-locked loop.

In the frequency syntheziser of FIG. 2, the reference frequency is provided by a stable crystal oscillator 4 (TCXO). The TCXO output frequency is divided by the first divider 5 (by the number R) in order to generate an appropriate phase comparison frequency. The phase comparison frequency obtained is directed to the phase comparator 1. The phase comparator output is fed into the loop filter 2. This loop filter is a low pass filter which removes the change components from the phase comparator output signal and applies a direct-current voltage to the control of the voltage-controlled oscillator 3 (VCO). From the output of the voltage-controlled oscillator 3, the feedback is taken through the prescaler 8 and the second divider 7, to the second input of the phase comparator 1. The second divider 7 of the feedback loop (divisor N) is programable, so that a plurality of frequencies can be synthesized by changing the divisor N. The prescaler reduces the frequency of the voltage-controlled oscillator 3 to the operational range of the programmable second divider 7, the frequency range of which usually is relatively narrow. The output of the voltage-controlled oscillator 3 simultaneously synthesizer output frequency $f_{out}$. Since this connection is well known to a person skilled in the art, it will not be described in detail.

Commercially available integrated circuits comprising first divider 5, the phase comparator 1 and the programmable divider 7, are readily available and these elements are indicated by the reference IC in FIG. 2.

Figure 3:
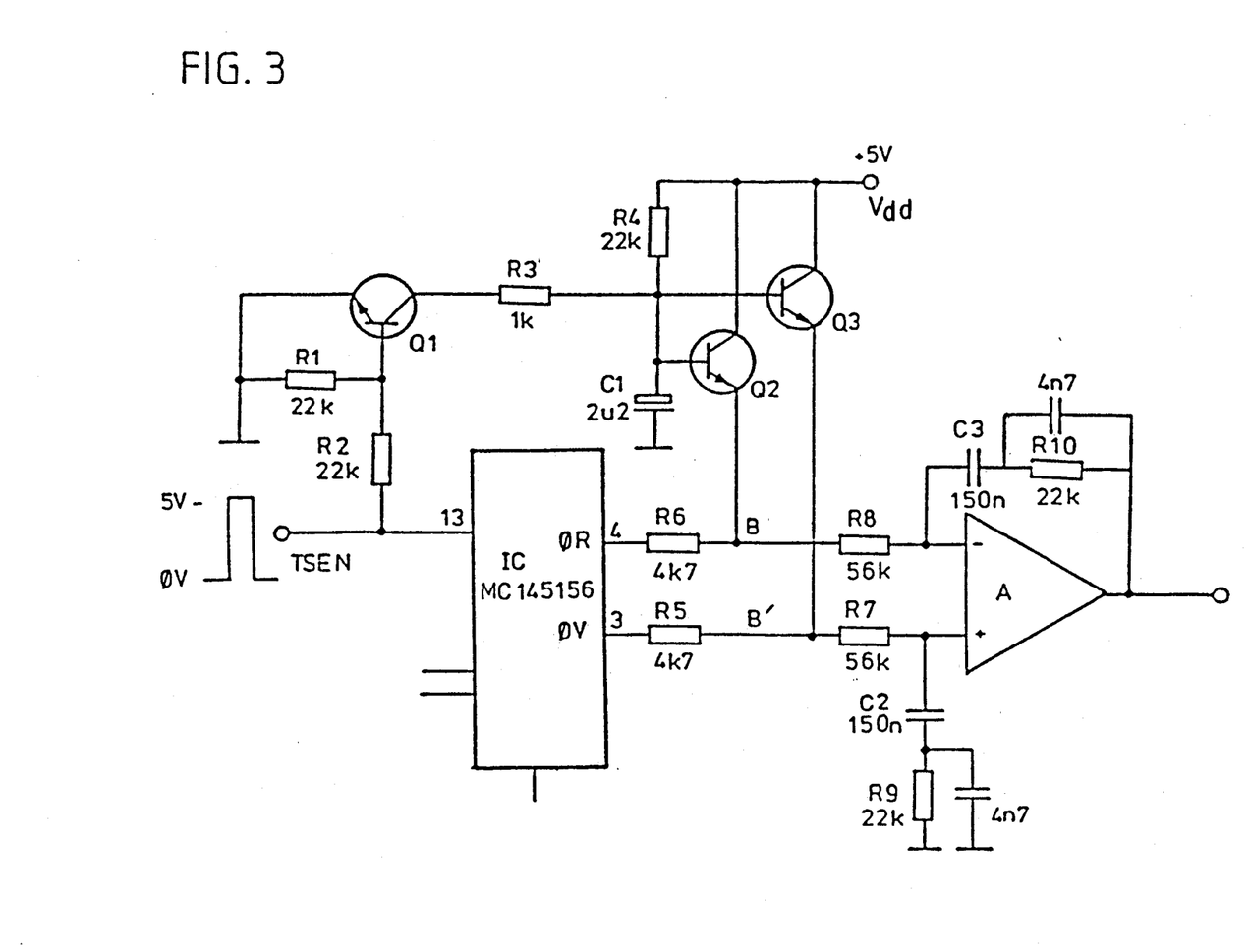
FIG. 3 shows an embodiment of the circuit according to the invention.

FIG. 3 show a circuit according to the present invention, in which the above integrated circuit IC is an MC145156 chip (manufactured by Motorola).

Figure 7A:
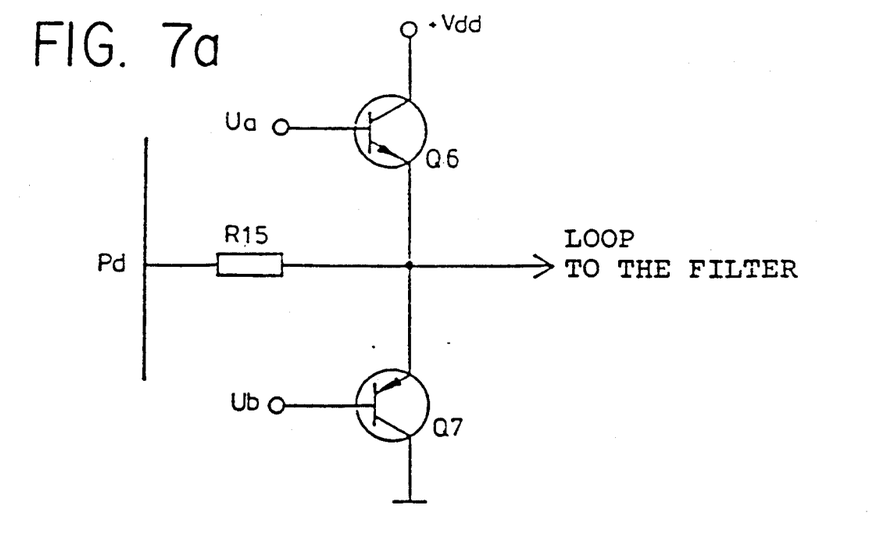
FIG. 7a represents a transistor limiter (Q6, Q7) set up outside of the digital phase comparator having single-ended output (Pd)
Figure 7B:
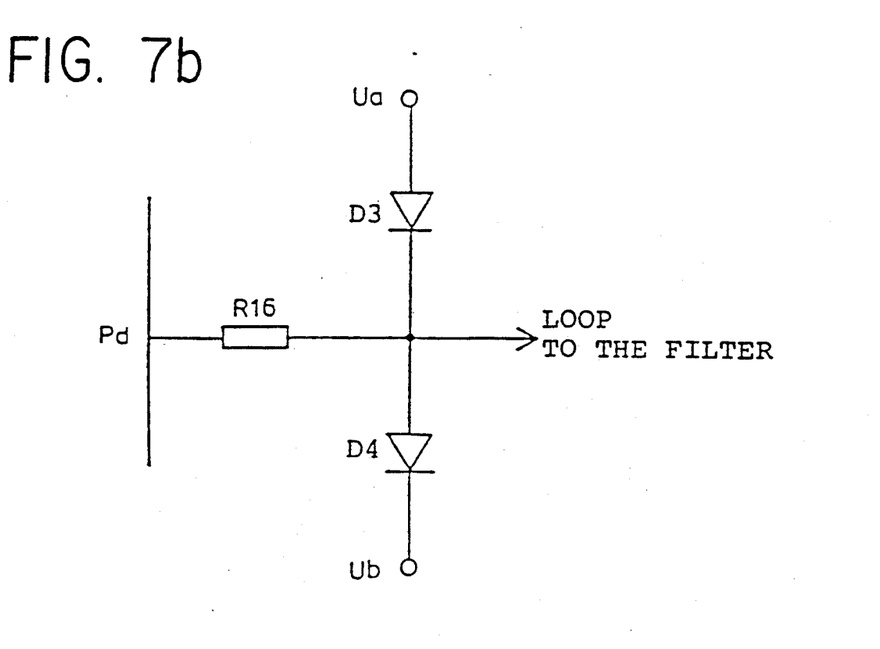
FIG. 7b represents a diode limiter (D3, D4) set up outside of the digital phase comparator having single-ended output (Pd).

This circuit includes a output phase comparator, the outputs of which are marked by $\phi V$ and $\phi R$ in FIG. 3. These outputs are taken through the resistors R5 and R6 to the integrator, which in the embodiment shown in FIG. 3 is performed by differential amplifier A. Nevertheless, a single-ended output phase comparator may also be used as shown in FIGS. 7a and 7b.

The natural oscillator frequency fn of the phase-locked loop is $$fn \approx \frac{1}{2\pi} \sqrt{\frac{K\phi \cdot Kvco}{N \cdot C \cdot R}} \quad (1)$$

in which $K\phi$ is the gain of the phase comparator $$Kvco \text{ is } \frac{2\pi \cdot \Delta fvco}{\Delta Vvco} \quad (2)$$

N is the total divisor (Fout/Fref)
C is approx. C2=C3 in the FIG. 3 and
R is approx. R7=R8 in the FIG. 3.
By changing $K\phi$ $$fn2 = \sqrt{\frac{K\phi 2}{K\phi 1}} \cdot fn1 \quad (3)$$

is obtained. In other words, the natural oscillator frequency of the loop is directly proportional to the square root of the gain of the phase comparator.

Figure 4:
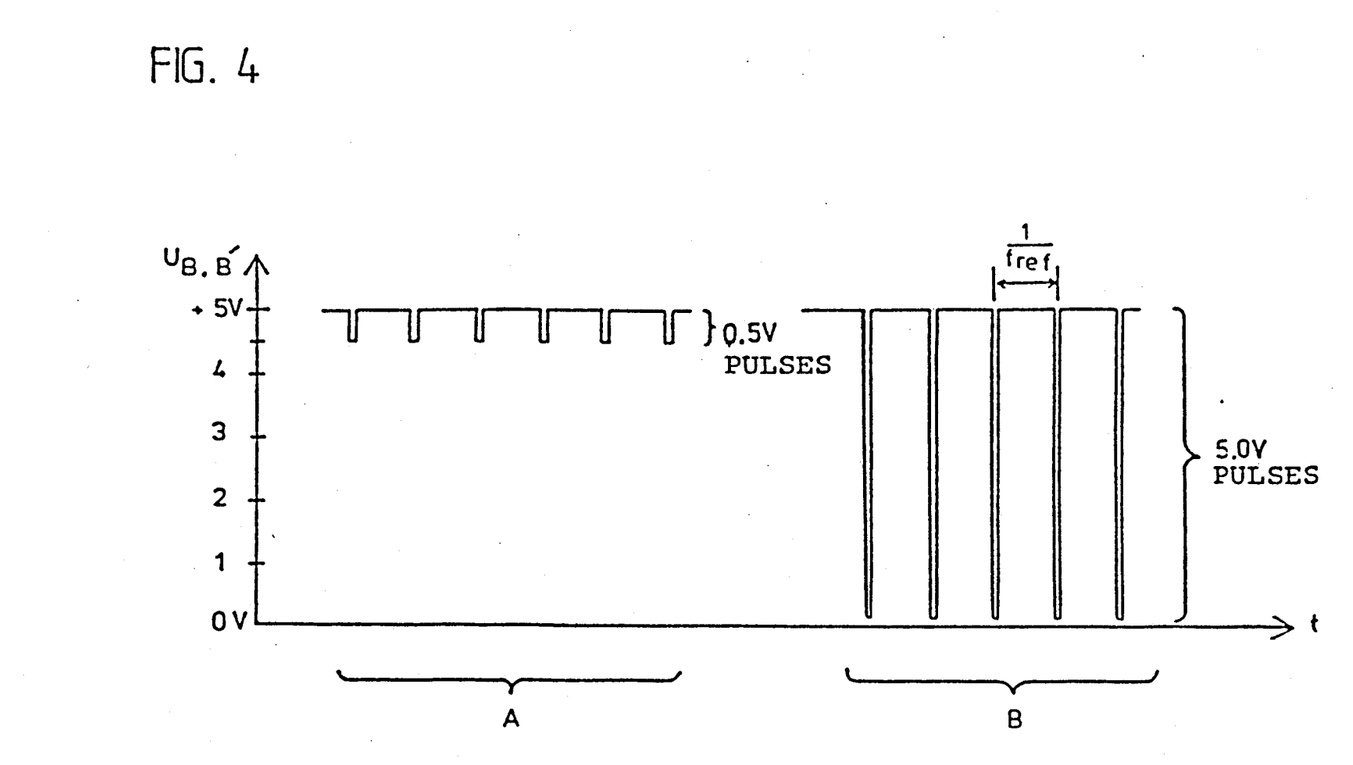
FIG. 4 is a graph of pulses relating to the circuit of FIG. 3.

In the embodiments of FIG. 3, the voltage of the pulses obtained from the outputs $\phi V$ and $\phi R$ of the phase comparator is influenced as follows:

After both outputs are applied to resistors R5, R6, the signals are applied to the emitters of limiting transistors Q3, Q2, respectively. The collectors of the transistors (Q3, Q2) are connected to the supply voltage Vdd (5 V). In a normal situation, a low limiting frequency (i.e., a slow loop is switched on with, the capacitor C1 being charged through the resistor R4 to +5 V and the transistors Q2 and Q3 limiting the 5 V voltage pulses of the outputs $\phi V$ and $\phi R$ to pulses of approx. 0.5 V, as shown in Section A of FIG. 4.

At the moment of channel switching, divisor information (i.e., a value for N) is fed into the programmable divider (e.g., element 7 of FIG. 2) of the circuit. Simultaneously, the activating pulse (TSEN) is fed into the terminal 13 of the microcircuit and provides a control through the resistor R2 to the base of the switch transistor Q1. Q1 then becomes momentarily conductive and the charge of the capacitor C1 is discharged through the resistor R3. Under these circumstances, the base voltage of the transistors Q2 and Q3 decreases to approximately 0 V and the height of the pulses on the emitters of the transistors rises momentarily to 5 V, as illustrated in Section B of FIG. 4.

The increased loop gain causes the loop bandwidth to increase. Sustaining the rapid loop, i.e., the high gain, depends on the time constant determined by the capacitor C1. In the described case, the rapid loop remains switched on for approximately 5 ms, which is enough for the loop to settle.

The natural oscillation frequency of the described phase-locked loop with the described circuit is about 80

Figure 5A:
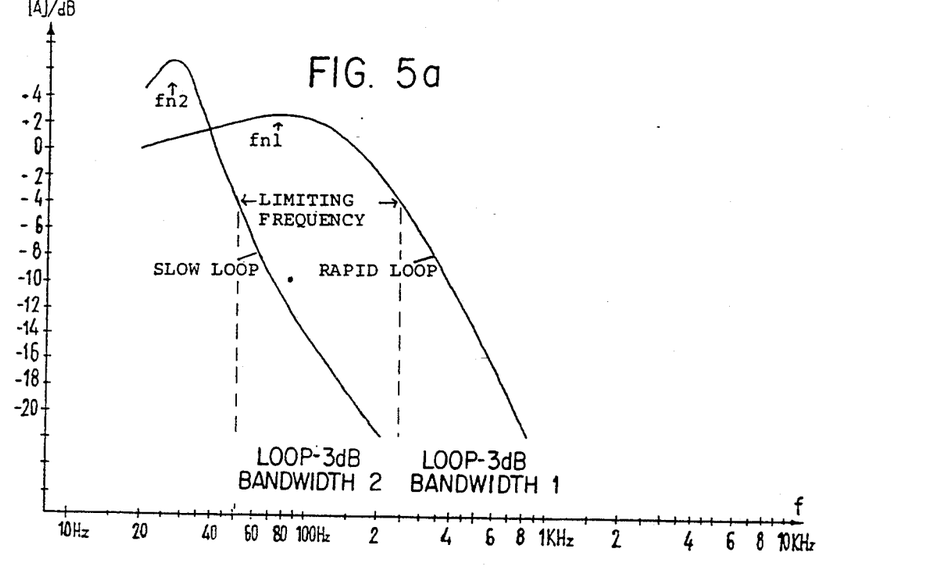
FIGS. 5a and 5b are graphs of frequency responses relating to the circuit of FIG. 3.
Figure 5B:
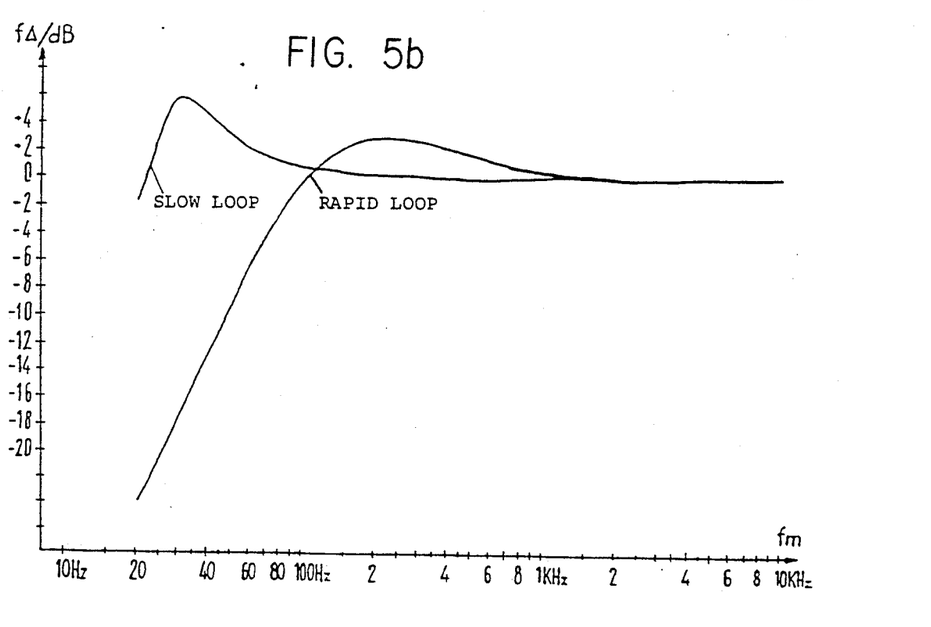

Hz with a rapid loop, (fn1), the natural oscillation frequency (fn2) of a slow loop is approx. $0.5/5 \times 80$ Hz, i.e., about 25 Hz. ($K\phi 1$. $K_{vco}/N = 2300$ Hz). The set of curves of FIG. 5 illustrates the response of the locked loop of a sample circuit with a rapid loop as well as with a slow one. From the response both the natural oscillation frequency fn and the $-3$ dB bandwidth of the locked loop are readable. Moreover, the modulation frequency response of this loop has been drawn in FIG. 5 both with a rapid and a slow loop. The modulation frequency response remains direct within the desired range 300 Hz to 10 kHz.

Figure 6A:
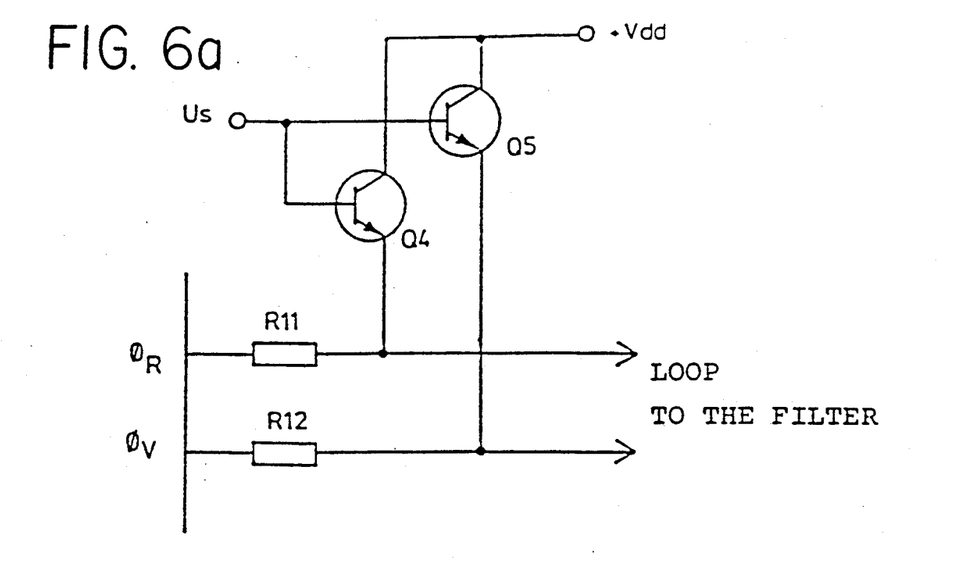
FIG. 6a represents a transistor limiter (Q4, Q5) set up outside of the digital phase comparator having double-ended outputs (QR, QV)
Figure 6B:
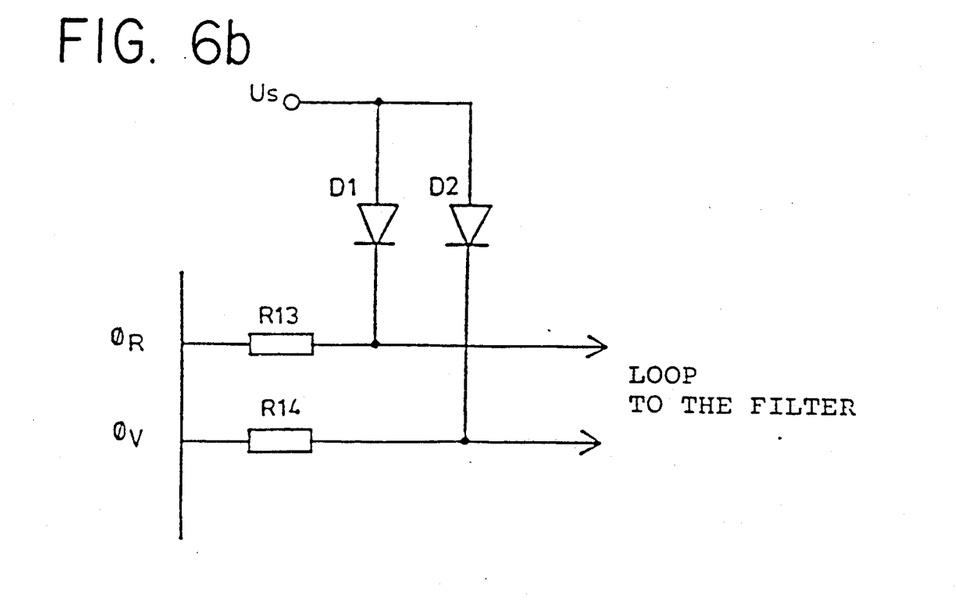
FIG. 6b represents a diode limiter (D1, D2) set up outside of the digital phase comparator having double-ended outputs (QR, QV)

FIGS. 6a and 6b show a limiter external to the phase comparator using transistors and diodes, respectively. The circuit shown in FIG. 6a limits the phase comparator output through a transistor limiter. The transistor limiter includes two transistors (Q4, Q5), each having its emitter connected to a resistor (R11, R12). Each resistor is connected to a respective output of the two-output phase comparator ($\phi R$, $\phi V$). Each transistor's collector is connected to the supply voltage ($+V_{dd}$). Thus, by varying the base voltage of each transistor, the emitter voltages will vary so as to regulate the output to the loop filter.

FIG. 6b shows a diode limiter for a two-output phase comparator. A first diode (D1) has its cathode connected to a resistor (R13) which, in turn, is connected to an output of the phase comparator ($\phi R$). The second diode (D2) has its cathode connected to a resistor (R14), which, in turn, is connected to the second output of the phase comparator ($\phi V$). By varying the voltage applied to the anodes of the diodes (Us), the diode outputs regulate the output applied to the loop filter.

FIGS. 7a and 7b show limiting circuits for limiting the output of a one-output phase comparator. FIG. 7a shows a transistor limiter having two emitter coupled transistors, wherein the emitters are both connected to a resistor (R15), which, in turn, is connected to the output (Pd) of the phase comparator. One transistor (Q6) is an NPN transistor having its collector connected to the supply voltage ($+V_{dd}$), and a second PNP transistor (Q7) has its collector connected to ground. Thus, by varying the voltage applied to the base of each transistor (Ua, Ub), the emitter voltages of the transistors are varied, thus modifying the voltage supplied to the loop filter.

FIG. 7b shows a diode limiter controlling a one-output phase comparator. This circuit comprises two diodes (D3, D4). The first diode (D3) has its cathode connected to the anode of the second diode (D4) and a resistor (R16). The resistor is connected to the output Pd of the phase comparator. By regulating the voltage applied to the anode of D3 (Ua) and the cathode of D4 (Ub), the output sent to the loop filter may be adjusted.

I claim:

1. A phase-locked loop circuit comprising:
   a digital phase comparator with a pulsed voltage output and having a reference frequency supplied to a first input;
   a loop filter which receives an output of the phase comparator;
   a voltage-controlled oscillator (VCO) which receives an output of the loop filter;
   a feedback branch connected from an output of the VCO to a second input of the phase comparator; and
   limiting means connected to the phase comparator for limiting the amplitude of the pulsed voltage output of the phase comparator so that the phase-locked loop has a modifiable bandwidth and locking rate.

2. The circuit of claim 1, wherein the limiting means are located in the phase comparator, the phase comparator output voltage being adjusted by regulating supply voltage supplied to the phase comparator.

3. The circuit of claim 1, wherein the limiting means comprises a limiting circuit external to the phase comparator.

4. The circuit of claim 3, wherein the limiting circuit includes at least one diode.

5. The circuit of claim 3, wherein the limiting circuit includes at least one transistor.

6. The circuit of claim 2, wherein the phase comparator output voltage is adjusted so that the phase-locked loop bandwidth is modified to be larger during locking and smaller after locking.

7. The circuit of claim 3, wherein the phase comparator output voltage is adjusted while the loop is locked so as to modify the phase-locked loop gain and bandwidth.

8. The circuit of claim 6, wherein the limiting means is connected between the phase comparator supply voltage and the loop filter, the limiting means increasing and decreasing the phase comparator output voltage in order to modify the phase-locked loop gain and bandwidth.

9. The circuit of claim 5, wherein the phase comparator has two outputs, and the limiting circuit comprises two transistors, each transistor having its emitter connected through a resistance to a separate phase comparator output, and each transistor having its collector connected to a voltage supplied to the phase comparator; whereby a change in voltage applied to each transistor's base regulates an output of each transistor's emitter, thus adjusting the phase comparator output voltages.

10. The circuit of claim 4, wherein the phase comparator has two outputs, and the limiting circuit comprises two diodes, each diode has a cathode connected through a resistance to a separate phase comparator output; whereby a change in voltage applied to each diode's anode regulates an output of each diode's cathode, thus adjusting the phase comparator output voltages.

11. The circuit of claim 5, wherein the phase comparator has one output, and the limiting circuit comprises a first and a second transistor, both transistors' emitters being connected together through a resistance to the phase comparator output; the first transistor being an NPN transistor and having its collector connected to a supply voltage, the second transistor being an PNP transistor and having its collector connected to a ground potential; whereby a change in voltage applied to each transistor's base regulates an output of each transistor's emitter, thus adjusting the phase comparator output voltage.

12. The circuit of claim 4 wherein the phase comparator has one output, and the limiting circuit comprises a first and second diode, the cathode of the first diode and the anode of the second diode are connected through a resistance to the phase comparator output; whereby a change in voltage applied to the anode of the first diode and the cathode of the second diode, thus adjusting the phase comparator output voltage.

* * * * *